United States Patent
Bedecarrats et al.

(10) Patent No.: US 11,296,072 B2
(45) Date of Patent: Apr. 5, 2022

(54) ELECTRONIC CIRCUIT WITH ELECTROSTATIC DISCHARGE PROTECTION

(71) Applicant: STMicroelectronics SA, Montrouge (FR)

(72) Inventors: Thomas Bedecarrats, Saint Martin d'Heres (FR); Louise De Conti, Grenoble (FR); Philippe Galy, Le Touvet (FR)

(73) Assignee: STMicroelectronics SA, Montrouge (FR)

( * ) Notice: Subject to any disclaimer, the term of this patent is extended or adjusted under 35 U.S.C. 154(b) by 146 days.

(21) Appl. No.: 16/454,230

(22) Filed: Jun. 27, 2019

(65) Prior Publication Data

US 2020/0006320 A1 Jan. 2, 2020

(30) Foreign Application Priority Data

Jun. 29, 2018 (FR) .................................... 1870781

(51) Int. Cl.
*H01L 27/02* (2006.01)

(52) U.S. Cl.
CPC ...... *H01L 27/0262* (2013.01); *H01L 27/0255* (2013.01)

(58) Field of Classification Search
CPC ............. H01L 27/0255; H01L 27/0262; H01L 27/1203
See application file for complete search history.

(56) References Cited

U.S. PATENT DOCUMENTS

| | | | | |
|---|---|---|---|---|
| 7,601,991 B2* | 10/2009 | Salcedo | .............. | H01L 29/7436 257/173 |
| 7,609,493 B1* | 10/2009 | Salman | ............... | H01L 27/0255 361/111 |
| 9,236,372 B2* | 1/2016 | Stockinger | .......... | H01L 27/0255 |
| 9,947,649 B1* | 4/2018 | Balakrishnan | .... | H01L 29/66136 |
| 2008/0088993 A1 | 4/2008 | Entringer et al. | | |
| 2010/0207161 A1 | 8/2010 | Shrivastava et al. | | |
| 2012/0319204 A1 | 12/2012 | Benoist et al. | | |
| 2015/0214210 A1 | 7/2015 | Jimenez et al. | | |
| 2016/0197042 A1* | 7/2016 | Lee | ..................... | H01L 23/5329 257/751 |
| 2017/0200783 A1* | 7/2017 | Zeng | ................... | H01L 29/0619 |
| 2018/0240797 A1* | 8/2018 | Yokoyama | ............ | H01L 23/552 |

FOREIGN PATENT DOCUMENTS

CN 104392992 B 4/2017

OTHER PUBLICATIONS

Athanasious, S., et al.: "Preliminary 3D TCAD Electro-thermal Simulations of BIMOS transistor in thin silicon film for ESD protection in FDSOI UTBB CMOS technology," 2015 Int. Conf. on IC Design and Technology (4 pages).

* cited by examiner

*Primary Examiner* — Thienvu V Tran
*Assistant Examiner* — Bart Iliya
(74) *Attorney, Agent, or Firm* — Crowe & Dunlevy

(57) ABSTRACT

A semiconductor substrate includes a doped region having an upper surface. The doped region may comprise a conduction terminal of a diode (such as cathode) or a transistor (such as a drain). A silicide layer is provided at the doped region. The silicide layer has an area that only partially covers an area of the upper surface of the doped region. The partial area coverage facilitates modulating the threshold voltage and/or leakage current of an integrated circuit device.

24 Claims, 6 Drawing Sheets

ELECTRONIC CIRCUIT WITH ELECTROSTATIC DISCHARGE PROTECTION

PRIORITY CLAIM

This application claims the priority benefit of French Application for Patent No. 1870781, filed on Jun. 29, 2018, the content of which is hereby incorporated by reference in its entirety to the maximum extent allowable by law.

TECHNICAL FIELD

The present disclosure generally concerns electronic circuits, and more particularly circuits of protection against electrostatic discharges.

BACKGROUND

Issues due to electrostatic discharges are all the more present as the size of components in electronic circuits decreases. The protection of electronic circuits against electrostatic discharges is an important issue to ensure the reliability and the durability of electronic circuits.

There thus is a need for electrostatic discharge protection circuits having better performance.

SUMMARY

An embodiment overcomes all or part of the disadvantages of known circuits of protection against electrostatic discharges.

An embodiment provides a device comprising a silicide layer partially covering a doped area.

According to an embodiment, the device further comprises a MOS-type transistor.

According to an embodiment, the device further comprises a diode.

According to an embodiment, the cathode of the diode and the drain of the transistor are formed by a first N type doped region.

According to an embodiment, the first N-type doped region has a dopant atom concentration in the range from $10^{17}$ to $10^{18}$ atoms/cm$^3$.

According to an embodiment, the doped area comprises at least the first N-type doped region partially covered with the silicide layer.

According to an embodiment, the doped area only comprises the first N-type doped region.

According to an embodiment, a portion of the anode of the diode is covered with a control electrode.

According to an embodiment, the silicide layer has a thickness in the range from 10 to 20 nm.

According to an embodiment, the device is formed inside and on top of a structure of silicon-on-insulator type.

According to an embodiment, the device is formed inside and on top of an ultra-thin type silicon-on insulator structure.

According to an embodiment, the doped area is covered with a single portion of silicide layer.

According to an embodiment, the doped area is covered with at least one portion of silicide layer.

According to an embodiment, the doped area is regularly covered with a plurality of portions of silicide layers.

Another embodiment provides a circuit of protection against electrostatic discharges comprising a previously described device.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
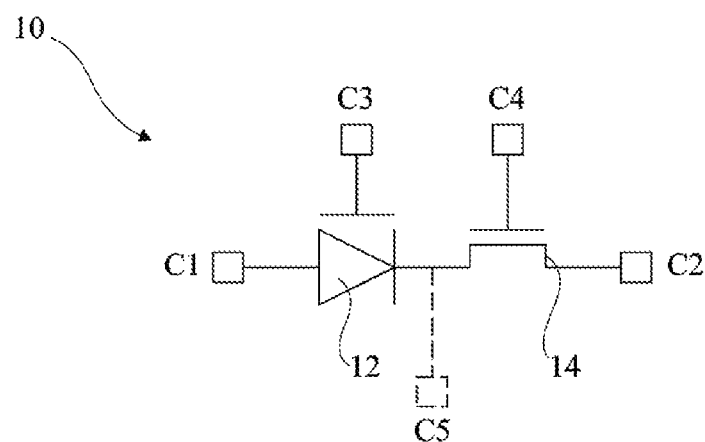
FIG. 1 shows an electronic diagram of a circuit of protection against electrostatic discharges.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the manufacturing of the circuit of protection against electrostatic discharges will not be detailed.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

As usual, the following terms are used:

"lightly-doped semiconductor layer" means a layer having a dopant atom concentration in the range from $10^{14}$ to $10^{16}$ atoms/cm$^3$;

"doped semiconductor layer" means a layer having a dopant atom concentration in the range from $10^{17}$ to $10^{18}$ atoms/cm$^3$; and "heavily-doped semiconductor layer" means a layer having a dopant atom concentration in the range from $10^{18}$ to $10^{21}$ atoms/cm$^3$.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "substantially", and "approximately" are used herein to designate a tolerance of plus or minus 10%, preferably of plus or minus 5%, of the value in question.

FIG. 1 is an electric diagram of a circuit of protection against electrostatic discharges 10.

Circuit 10 comprises a diode 12. Diode 12, also referred to in the art as a gated diode, is equipped with a control electrode arranged on a portion of its anode region. The control electrode enables to improve the conduction of the PN junction of diode 12. The control electrode of diode 12 will be described in further detail in relation with FIG. 2.

Circuit 10 further comprises a transistor 14. Transistor 14 is a MOS-type transistor, and more particularly an N-channel MOS transistor.

Diode 12 and transistor 14 are series-connected. More particularly, the cathode of diode 12 is connected to the drain of transistor 14 and, more particularly still, in the embodiment described in relation with FIG. 2, the cathode of diode 12 and the drain of transistor 14 are formed by one and the same N-type doped region within a semiconductor substrate. The anode of diode 12, the source of transistor 14, the control electrode of diode 12, and the gate of transistor 14 are respectively coupled to contacts C1, C2, C3, and C4 external to the integrated circuit chip of circuit 10. As an example, a contact C5 (in dotted lines in the drawings) may be coupled to the cathode of diode 12 and to the drain of transistor 14.

Circuit 10 may have an operation similar to that of a thyristor.

The structure of circuit 10 will be described in further detail in relation with FIG. 2.

Figure 2:
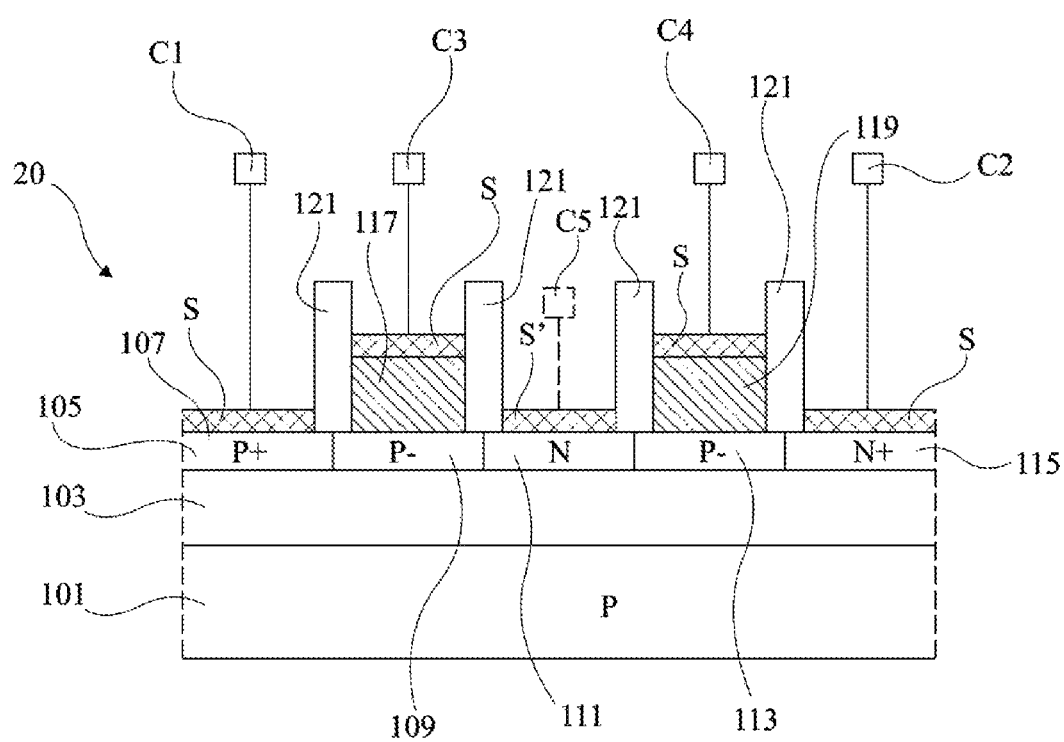
FIG. 2 shows a cross-section view of an embodiment of the circuit of FIG. 1.

FIG. 2 is a cross-section view of an embodiment of a structure 20 of a circuit of the type of circuit 10 described in relation with FIG. 1.

Structure 20 is formed inside and on top of a substrate structure of silicon on insulator type (SOI) type comprising a semiconductor substrate 101, for example, made of silicon, supporting an insulating layer 103, for example, made of silicon oxide, having a semiconductor layer 105, for example, made of silicon, resting thereon. More particularly, structure 20 is formed inside and on top of a FD-SOI-type structure ("Fully Depleted Silicon On Insulator"), that is, a structure of ultra-thin silicon on insulator type. Insulating layer 103 has a thickness, for example, in the range from 15 nm to 30 nm, for example, in the order of 25 nm. Conductive layer 105 has a thickness for example in the range from 5 nm to 22 nm, for example, in the order of 15 nm.

Semiconductor layer 105 is divided into a plurality of doped regions, or doped areas, among which, from left to right in FIG. 2:
a heavily P-type doped region 107 (P+);
a lightly P-type doped region 109 (P−);
an N-type doped region 111 (N);
a lightly P-type doped region 113 (P−); and
a heavily N-type doped region 115 (N+).

Insulated gates 117 and 119, or control electrode 117 and insulated gate 119, are arranged on top of and in contact with, respectively, regions 109 and 113. Each gate 117, 119 is formed of a layered structure (not explicitly illustrated) comprising a gate oxide layer having a conductive layer resting thereon. More particularly, insulated gates 117 and 119 are HKMG-type gates ("High-K Metal Gate"). Thus, the gate oxide layer is made of a high-permittivity dielectric material, for example, hafnium oxide. A gate oxide layer generally does not directly rest on a silicon region, the presence of an interface layer, for example, made of silicon oxide, being required. As an example, the thickness of gate oxide layer is in the range from 1 to 10 nm, for example, in the order of 2 nm. The conductive layer is generally a stack of different conductive layers, for example, a titanium nitride layer and a polysilicon layer. As an example, the conductive layer has a thickness for example in the order of 50 nm. Gates 117 and 119 are shown in FIG. 2 by blocks which do not detail the layers forming them. Gates 117 and 119 are laterally delimited by insulating walls 121. Each insulating wall 121 is for example arranged on a junction between two doped regions of layer 105. Insulating walls 121 are for example made of silicon nitride and/or of silicon oxide.

Contacts C1, C2, C3, and C4 (symbolized in FIG. 2 by squares) are formed on areas of regions 107 and 115, and on areas of gates 117 and 119. Contacts C1, C2, C3, and C4 are for example made of metal. For manufacturing reasons, contacts C1, C2, C3, and C4 cannot be directly formed on regions 107 and 115 and gates 117 and 119, and the presence of an intermediate conductive layer, for example, made of a silicide, is necessary. For this purpose, regions 107 and 115 and gates 117 and 119 are each covered with a conductive layer S made of a silicide. More particularly, contacts C3 and C4 are not directly arranged above gates 117 and 119 (see FIG. 3). Layer S is, for example, made of a nickel silicide (NiSi). Layer S has a thickness for example in the range from 10 to 30 nm, for example, in the order of 12.5 nm. As an example, the silicide layers may have different thicknesses according to what they cover, for example, the silicide layers S covering regions 107 and 115 may have a thickness in the order of 15 nm, and the silicide layers S covering gates 117 and 119 may have a thickness in the order of 25 nm.

Region 111 is further partially covered with a silicide layer S'. Silicide layer S' has the same dimension and material characteristics as silicide layers S. The distribution mode of layer S' on region 111 will be described in further detail in relation with FIG. 3. As an example, a contact C5 may further be formed on layer S' and region 111.

The assembly of regions 107, 109, 111, and of gate 117 forms diode 12. Regions 107 and 109 form the anode of diode 12. Region 111 forms the cathode of diode 12. Insulated gate 117 forms the control electrode of diode 12.

The assembly of regions 111, 113, 115, and of gate 119 forms transistor 14. Region 111 forms the drain of transistor 14. Region 113 forms the channel region of transistor 14. Region 115 forms the source of transistor 14. Gate 119 forms the gate of transistor 14.

Figure 3:
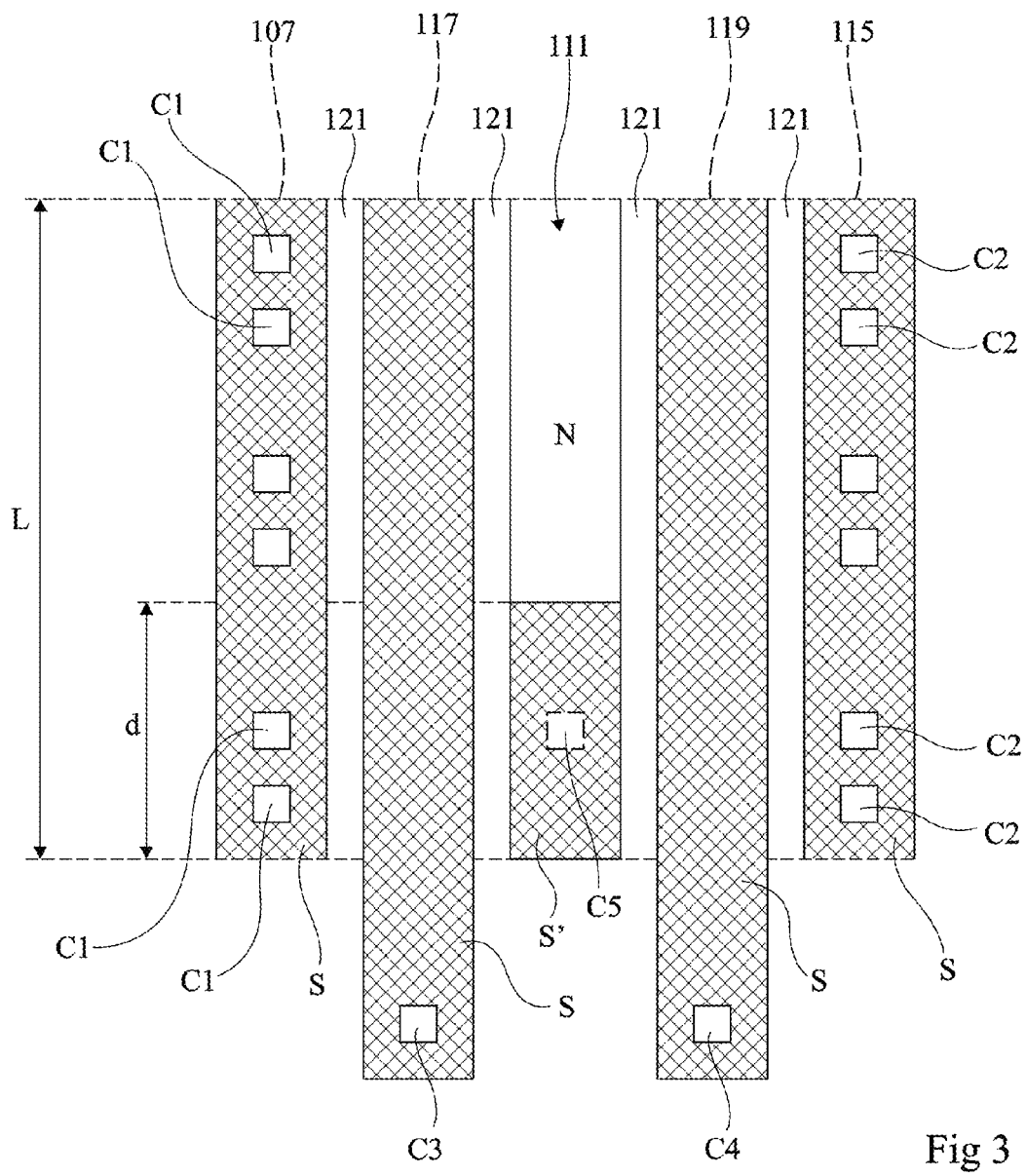
FIG. 3 shows a top view of the embodiment of FIG. 2.

FIG. 3 is a top view of the structure of circuit 10 described in relation with FIG. 2. In FIG. 3, the location of contacts C1, C2, C3, C4, and C5 is designated in the same way as in FIG. 2, with squares.

As previously indicated, silicide region S' only partially covers region 111. In the example shown in FIG. 3, layer S' covers region 111 across its entire width but not along its entire length L. Layer S' then has a length d<L. As an example, for a length L in the order of 10 μm, length d may for example be equal to 2, 4, 6, or 8 μm. As a variation, layer S' may not cover region 115 across its entire width.

The inventors have observed that by controlling (selecting) the proportion of the area of N-type doped region 111 covered by the area of the silicide layer S', it is possible to adjust the threshold voltage of circuit 10 formed by structure 20.

The inventors have further observed that controlling (selecting) the proportion of the area of region 111 covered by the area of silicide layer S' enables to modulate the value of the leakage currents of circuit 10.

Further, contacts C3 and C4 are formed on portions of silicide layers S which do not directly rest on gates 117 and 119. Indeed, usual contact forming methods risk degrading gates 117 and 119.

Figure 4:
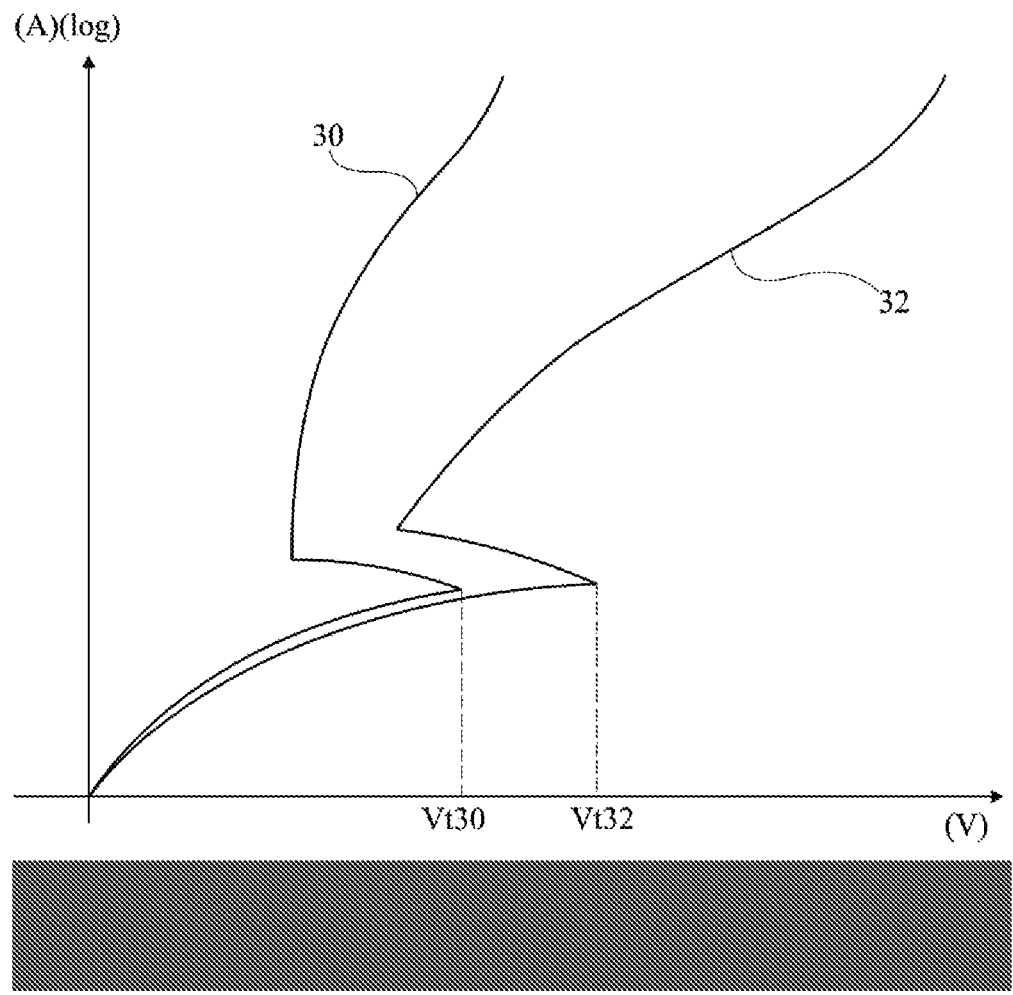
FIG. 4 is a graph showing a current vs. voltage characteristic of the circuit of FIG. 1.

FIG. 4 is a graph in logarithmic scale showing current vs. voltage characteristics of circuits of the type of the circuit of FIG. 1. More particularly, FIG. 4 shows current vs. voltage characteristics of ACS ("Average Current Slope") type, that is, current vs. voltage characteristics obtained by progressively increasing the current sent onto the anode of diode 12 and by measuring the voltage between the potential of anode 12 and a reference potential. An ACS-type current vs. voltage characteristic enables to determine the value of the threshold voltage of circuit 10.

Indeed, according to the use of the circuit of protection against electrostatic discharges, the threshold voltage, or turn-on voltage, of circuit 10 should be smaller than the maximum voltage authorized by the circuit, or the terminal, to be protected.

The graph of FIG. 4 comprises two curves 30 and 32. Each curve 30, 32 represents the current vs. voltage characteristic of a circuit having a structure of the type of structure 20 described in relation with FIGS. 2 and 3. Curve 30 represents the current vs. voltage characteristic of a circuit having its silicide layer S' area covering a smaller area portion of region 111 than silicide layer S' of the circuit having its current vs. voltage characteristic represented by curve 32. It should be noted that threshold voltage Vt30 of the circuit of curve 30 is smaller than threshold voltage Vt32 of the circuit of curve 32. Thus, decreasing the area (size) of the portion of region 111 covered with a silicide layer S' enables to decrease the threshold voltage of the corresponding circuit.

Figure 5:
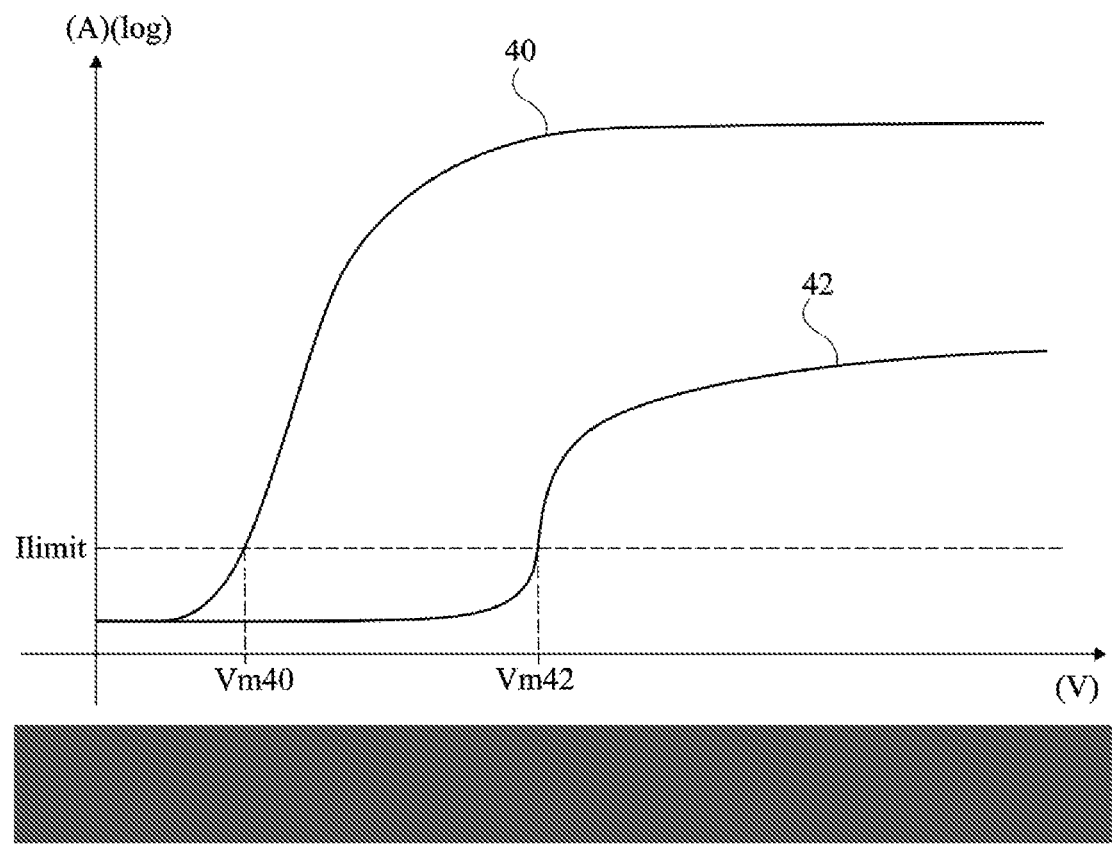
FIG. 5 is a graph showing another current vs. voltage characteristic of the circuit of FIG. 1.

FIG. 5 is a graph showing other current vs. voltage characteristics of circuits of the type of the circuit of FIG. 1. More particularly, FIG. 5 shows current vs. voltage characteristics of AVS ("Average Voltage Slope") type, that is, current vs. voltage characteristics obtained by progressively increasing the voltage between the potential of anode 12 and a reference potential, and by measuring the current present on the anode of diode 12. An AVS-type current vs. voltage characteristic enables, among others, to determine the value of the maximum voltage across the circuit of protection against electrostatic discharges not to be exceeded to avoid too high a current consumption and leakage currents.

Indeed, by setting a limiting current Ilimit on the current vs. voltage characteristic, it is possible to determine the maximum voltage that the circuit can withstand without exceeding limiting current Ilimit.

The graph of FIG. 5 comprises curves 40 and 42. Each curve 40, 42 shows the current vs. voltage characteristic of a circuit having a structure of the type of structure 20 described in relation with FIGS. 2 and 3. Curve 40 shows the current vs. voltage characteristic of a circuit having its silicide layer S' area covering a smaller portion of doped region 111 than silicide layer S' of the circuit having its characteristics represented by curve 42. It should be noted that voltage Vm40 of circuit 40 reached for limiting current Ilimit is smaller than voltage Vm42 of circuit 42 reached for limiting current Ilimit. Thus, the more of region 111 of the circuit that is covered with silicide, the less significant the current consumption and the leakage currents.

For a given application, it is thus important to determine the proportion of silicide layer S' enabling to obtain an adequate threshold voltage and power consumption.

Figure 6:
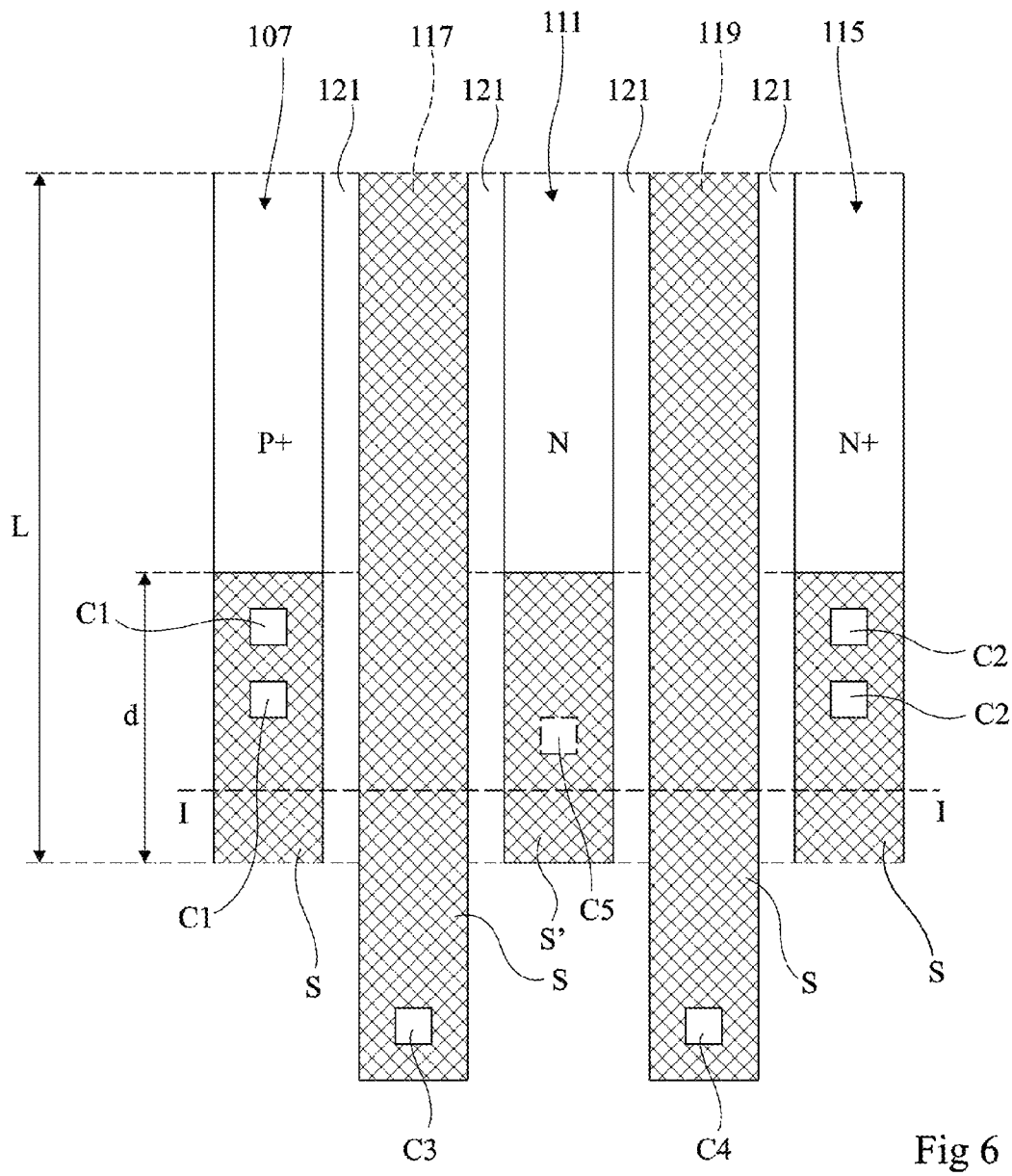
FIG. 6 shows a top view of another embodiment of the circuit of FIG. 1.

FIG. 6 is a top view of another embodiment of structure 20. The cross-section view along line I-I is similar to the cross-section view of FIG. 2. In this embodiment, silicide layers S also partially cover regions 107 and 115 and gates 117 and 119 (thus the area of silicide layer S is smaller than the area of regions 107 and 115).

Figure 7:
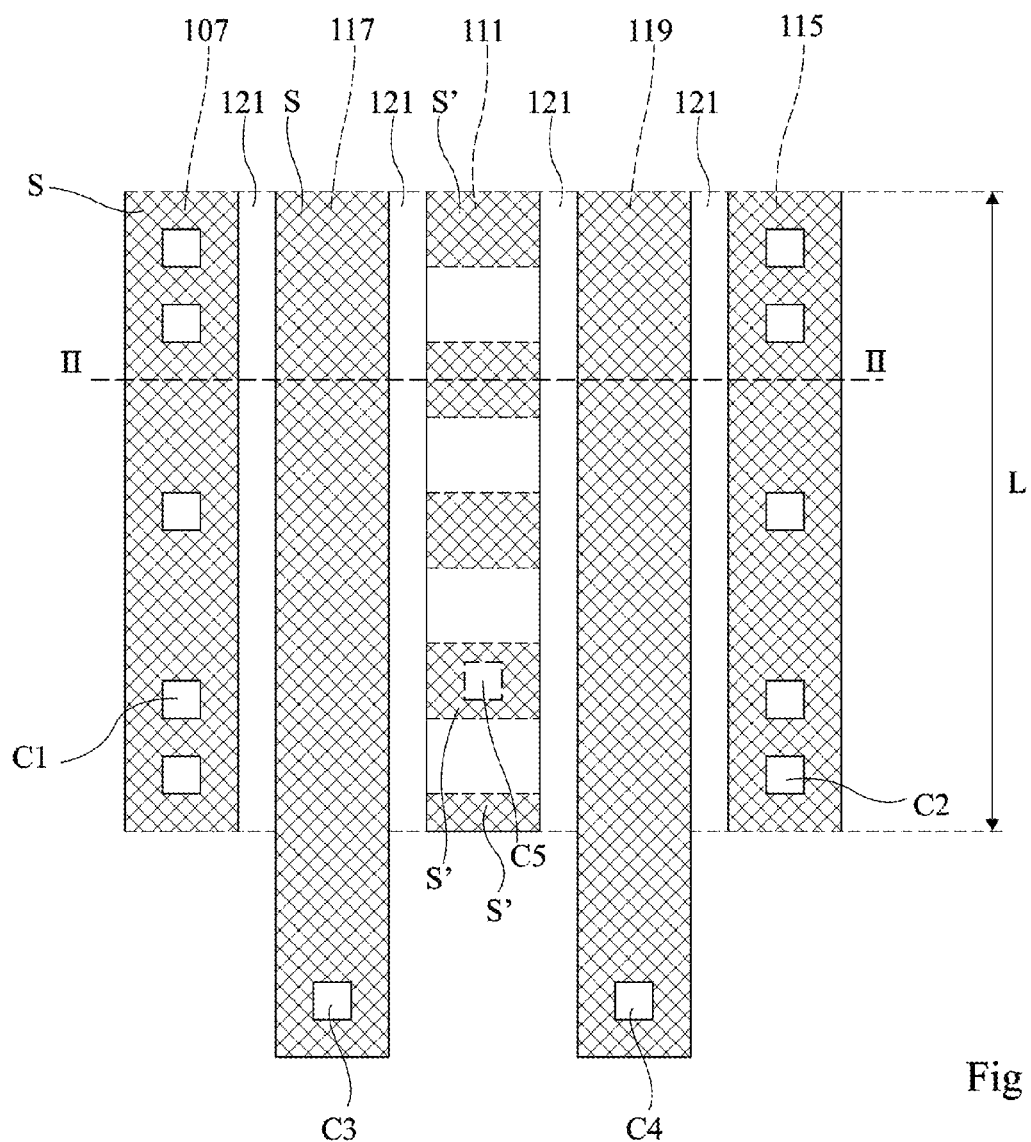
FIG. 7 shows a top view of still another embodiment of the circuit of FIG. 1.

FIG. 7 is a top view of still another embodiment of structure 20. The cross-section view along line II-II is similar to the cross-section view of FIG. 2.

In this embodiment, region 111 is covered, for example, evenly, with a plurality of portions of silicide layer S' rather than with a single portion of silicide layer S' (wherein a sum of the areas of the portions is less than the area of region 111).

An advantage of this embodiment is that by dividing silicide layer S' into a plurality of portions, the distribution of the portions is more regular relative to the area of region 111, which enables to avoid irregularities of the current at the level of the structure.

An advantage of the embodiments described in relation with FIGS. 1 to 7 is that their manufacturing method requires no additional cost with respect to a method of manufacturing a circuit having its doped regions and its gates totally covered with silicide.

Various embodiments and variations have been described. It will be understood by those skilled in the art that certain characteristics of these various embodiments and variations may be combined, and other variations will occur to those skilled in the art.

In particular, in FIG. 3, structure 20 has a rectangular shape in top view, but as a variation, structure 20 may for example have the shape of a ring or any other shape adapted to the operation of structure 20.

Further, the embodiment described in relation with FIG. 6 may be combined with the embodiment described in relation with FIG. 7.

Further, region 111 is N-type doped but it may be heavily N-type doped.

Further, the deposition of a partial silicide layer on a doped portion may be applied to other types of circuit of protection against electrostatic discharges, such as those circuit which are described in S. Athanasiou et al.'s article entitled "Preliminary 3D TCAD Electro-thermal Simulations of BIMOS transistor in thin silicon film for ESD protection in FDSOI UTBB CMOS technology", 2015 Intl. Conf. on IC Design and Technology.

Finally, the practical implementation of the described embodiments and variations is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:
1. An integrated circuit device, comprising:
   a semiconductor substrate;
   a transistor having a transistor gate extending in a length direction over a channel region of the semiconductor substrate;
   a diode having diode gate extending in the length direction over an anode region of the semiconductor substrate;
   the semiconductor substrate including a doped region located between the transistor gate and the diode gate, said doped region extending in the length direction and having an upper surface;
   a silicide layer in contact with the upper surface of the doped region, wherein said silicide layer has an area that only partially covers an area of the upper surface of the doped region, said area of the silicide layer having a length that is shorter than a length of the area of the upper surface of the doped region, wherein the length of the area of the silicide layer and the length of the area of the upper surface of the doped region both extend parallel to the length direction;

wherein the doped region forms a cathode of the diode and a drain of the transistor which are electrically connected in series with each other;

wherein the semiconductor substrate further includes a source region for said transistor, said source region extending in the length direction and having an upper surface; and a further silicide layer in contact with the upper surface of the source region, wherein said further silicide layer has an area that only partially covers an area of the upper surface of the further doped region, said area of the further silicide layer having a length that is shorter than a length of the area of the upper surface of the source region, wherein the length of the area of the further silicide layer and length of the area of the upper surface of the source region both extend parallel to the length direction.

2. The integrated circuit device of claim 1, wherein a portion of an anode of the diode is covered with a control electrode.

3. The integrated circuit device of claim 1, wherein the doped region has a dopant concentration in a range from $10^{17}$ to $10^{18}$ atoms/cm$^3$.

4. The integrated circuit device of claim 1, wherein the semiconductor substrate further includes an anode region for said diode, said anode region extending in the length direction and having an upper surface, and further comprising another silicide layer in contact with the upper surface of the anode region, wherein said another silicide layer has an area that only partially covers an area of the upper surface of the anode region, said area of the another silicide layer having a length that is shorter than a length of the area of the upper surface of the anode region, wherein the length of the area of the another silicide layer and length of the area of the upper surface of the anode region both extend parallel to the length direction.

5. The integrated circuit device of claim 1, wherein the diode and transistor which are electrically connected in series with each other form a circuit of protection against electrostatic discharges.

6. The integrated circuit device of claim 1, wherein the silicide layer has a thickness in a range from 10 to 30 nm.

7. The integrated circuit device of claim 1, wherein the semiconductor substrate is a semiconductor layer of a silicon-on-insulator structure.

8. The integrated circuit device of claim 7, wherein the silicon-on-insulator structure is of an ultra-thin silicon-on-insulator type.

9. The integrated circuit device of claim 1, wherein the area of the upper surface of the doped region is covered with only a single portion of the silicide layer.

10. The integrated circuit device of claim 1, wherein the doped region is part of a circuit of protection against electrostatic discharges.

11. An integrated circuit device, comprising:
a semiconductor substrate;
a transistor having a transistor gate extending in a length direction over a channel region of the semiconductor substrate;
a diode having diode gate extending in the length direction over an anode region of the semiconductor substrate;
the semiconductor substrate including a doped region located between the transistor gate and the diode gate, said doped region extending in the length direction and having an upper surface; and
a silicide layer in contact with the upper surface of the doped region, wherein said silicide layer includes a plurality of portions, and wherein the plurality of portions together have a total area that only partially covers an area of the upper surface of the doped region;
wherein the portions of said plurality of portions are separated from each other along said length direction.

12. The integrated circuit device of claim 11, wherein the doped region is one of a source or drain region of a MOS-type transistor.

13. The integrated circuit device of claim 11, wherein the doped region is one of an anode or cathode of a diode.

14. The integrated circuit device of claim 13, wherein a portion of the anode of the diode is covered with a control electrode.

15. The integrated circuit device of claim 11, wherein the doped region forms a cathode of the diode and a drain of the transistor which are electrically connected in series with each other.

16. The integrated circuit device of claim 15, wherein the doped region has a dopant concentration in a range from $10^{17}$ to $10^{18}$ atoms/cm$^3$.

17. The integrated circuit device of claim 15, further comprising a further silicide layer having an area that only partially covers an area of the upper surface of a further doped region in the semiconductor substrate forming an anode of the diode.

18. The integrated circuit device of claim 15, further comprising a further silicide layer having an area that only partially covers an area of the upper surface of a further doped region in the semiconductor substrate forming a source of the transistor.

19. The integrated circuit device of claim 15, wherein the diode and transistor which are electrically connected in series with each other to form a circuit of protection against electrostatic discharges.

20. The integrated circuit device of claim 11, wherein the silicide layer has a thickness in a range from 10 to 30 nm.

21. The integrated circuit device of claim 11, wherein the semiconductor substrate is a semiconductor layer of a silicon-on-insulator structure.

22. The integrated circuit device of claim 11, wherein the silicon-on-insulator structure is of an ultra-thin silicon-on-insulator type.

23. The integrated circuit device of claim 11, wherein the portions of said plurality of portions are arranged with a regular regularly spacing between each other along the length direction.

24. The integrated circuit device of claim 11, wherein the doped region is part of a circuit of protection against electrostatic discharges.

* * * * *

UNITED STATES PATENT AND TRADEMARK OFFICE
CERTIFICATE OF CORRECTION

PATENT NO. : 11,296,072 B2
APPLICATION NO. : 16/454230
DATED : April 5, 2022
INVENTOR(S) : Thomas Bedecarrats et al.

It is certified that error appears in the above-identified patent and that said Letters Patent is hereby corrected as shown below:

In the Claims

At Column 8, Claim No. 23, Line 56, please delete the word "regularly".

Signed and Sealed this
Eighteenth Day of October, 2022

Katherine Kelly Vidal
*Director of the United States Patent and Trademark Office*